US007016199B2

(12) United States Patent
Burgers et al.

(10) Patent No.: US 7,016,199 B2
(45) Date of Patent: Mar. 21, 2006

(54) RECEIVER WITH SLIDING HANGER STRUCTURE

(75) Inventors: Henri Burgers, High Point, NC (US); P. Anthony Sedberry, Jr., High Point, NC (US); W. Kent Maness, High Point, NC (US)

(73) Assignee: Mac Panel Company, High Point, NC (US)

( * ) Notice: Subject to any disclaimer, the term of this patent is extended or adjusted under 35 U.S.C. 154(b) by 63 days.

(21) Appl. No.: 10/642,663

(22) Filed: Aug. 19, 2003

(65) Prior Publication Data

US 2005/0041408 A1 Feb. 24, 2005

(51) Int. Cl.
 *H05K 7/18* (2006.01)
(52) U.S. Cl. .................... 361/801; 361/759; 439/51
(58) Field of Classification Search ................ 439/157, 439/347, 51; 361/801, 802, 732, 740, 741, 361/747, 759
See application file for complete search history.

(56) References Cited

U.S. PATENT DOCUMENTS

| | | | |
|---|---|---|---|
| 3,170,746 A * | 2/1965 | Aksu ........................... 439/51 |
| 3,300,750 A * | 1/1967 | Harner et al. ................. 439/51 |
| 3,303,454 A * | 2/1967 | Crowley et al. .............. 439/51 |
| 3,323,095 A * | 5/1967 | Bush et al. .................... 439/51 |
| 3,341,801 A * | 9/1967 | Brookman et al. ........... 439/51 |
| 3,418,621 A * | 12/1968 | Campbell, Jr. ............... 439/51 |
| 3,419,842 A * | 12/1968 | Taylor, Jr. .................... 439/51 |
| 4,329,005 A | 5/1982 | Braginetz et al. ............ 339/18 |
| 4,542,951 A * | 9/1985 | Mummey et al. ........... 439/329 |
| 5,947,756 A * | 9/1999 | Kodama ..................... 439/157 |
| 6,010,351 A * | 1/2000 | Kuboto ....................... 439/347 |
| 6,183,279 B1 * | 2/2001 | Murakami et al. .......... 439/157 |

* cited by examiner

*Primary Examiner*—Kamand Cuneo
*Assistant Examiner*—Due Tran
(74) *Attorney, Agent, or Firm*—Sutherland Asbill & Brennan LLP

(57) ABSTRACT

A receiver designed to receive and engage an interchangeable test adapter (ITA) such that electrical contacts carried by the ITA and receiver are releasably engaged. The receiver includes sliding cam plates driven by a lever assembly and adjacent sliding hanger structures that are retractable. The sliding hanger structures are biased to extend forwardly, and are mounted within hanger slide retaining structures that define forward stops. When an ITA is to be engaged with the receiver, roller pins of the ITA are placed in the hangers such that they also extend into the adjacent sliding cam plates. When the user actuates the lever, the cam plates force the ITA to move inwardly, into engagement. The motion of the cam plates also forces the hanger structures to slide inwardly, such that they are flush with the face of the receiver.

36 Claims, 12 Drawing Sheets

RECEIVER WITH SLIDING HANGER STRUCTURE

BACKGROUND OF THE INVENTION

1. Field of the Invention

The invention relates generally to the field of electrical connectors and, more specifically, to receivers having slide cam mechanisms that are designed to facilitate the engagement of the receiver and an interchangeable test adapter.

2. Description of Related Art

In the process of testing complex electrical and electromechanical systems, it is often desirable to bring many electrical contacts into contact with each other simultaneously, so as to facilitate efficient connection and disconnection of testing equipment and particular units under test. One particular type of connection mechanism that may be used for this purpose is the connection system disclosed in U.S. Pat. No. 4,329,005 to Braginetz et al., the contents of which are incorporated herein by reference in their entirety.

The Braginetz et al. patent discloses a rectangular receiver that includes two lever-driven sliding cam plates, one on each of the left and right inner faces of the receiver. Each sliding cam plate includes a profiled cam slot. The receiver also includes a stationary hanger plate positioned directly adjacent to the profiled cam slot of each sliding cam plate. A portion of the stationary hanger plate projects horizontally from the receiver. The receiver is designed to engage an interchangeable test adapter (ITA) that carries corresponding electrical contacts. When the electrical contacts carried by an ITA are to be brought into engagement with corresponding electrical contacts in the receiver, rollers on each of the left and right sides of the ITA are initially placed so that they rest partially on the respective stationary hanger plates and partially in the profiled cam slots of the sliding cam plates. When the lever that drives the sliding cam plates is actuated, the action of the profiled cam slots against the rollers of the ITA forces the ITA to move inwardly or outwardly, towards or away from the receiver, depending on the direction of lever actuation. Therefore, the motion of the lever and the consequent motion of the sliding cam plates causes the electrical contacts carried by the ITA and those carried by the receiver to move into or out of engagement with one another.

Typically, the ITA would carry wiring and associated connectors for a unit under test, while the receiver would carry wiring and associated connectors for the corresponding test equipment. In some configurations, the ITA may include an electromagnetic shielding enclosure.

Users of commercial receivers similar to the type disclosed in Braginetz et al. have found horizontally extending hanger plates to be very convenient, because they allow an ITA to rest on the receiver without being brought into engagement with it. However, the hanger plates do create certain problems. For example, if the receiver includes hanger plates, an electromagnetic shielding enclosure used with the ITA can be essentially no wider than the engaging portion of the ITA, because a wide shielding enclosure may contact the horizontally projecting ends of the hanger plates and prevent the ITA from being brought into engagement with the receiver. Additionally, the hanger structures of the Braginetz et al. patent make it difficult to rest an ITA in the hangers without actuating the engaging mechanism.

SUMMARY OF THE INVENTION

One aspect of the invention relates to a receiver structure for receiving a test adapter having external locating portions. The receiver structure comprises a generally rectangular frame having left and right inwardly facing surfaces. Left and right cam plates are slidingly mounted adjacent to the left and right inwardly facing surfaces of the generally rectangular frame. Each of the left and right cam plates includes a cam slot. The receiver structure also includes a lever assembly, including a user accessible lever portion. The lever assembly is arranged in a driving relationship with the left and right cam plates.

In addition to the above features, the receiver structure comprises two or more hanger structures. One of the hanger structures is mounted adjacent to each of the left and right cam plates for sliding movement between an outwardly projecting position and a retracted position. Each of the at least two hanger structures includes a guide slot.

Another aspect of the invention relates to a testing apparatus. The testing apparatus comprises a receiver and an interchangeable test adapter. The receiver includes a generally rectangular frame having left and right inwardly facing surfaces. Left and right cam plates are slidingly mounted adjacent to the left and right inwardly facing surfaces of the generally rectangular frame. Each of the left and right cam plates includes a cam slot. The receiver structure also includes a lever assembly, including a user accessible lever portion. The lever assembly is arranged in a driving relationship with the left and right cam plates. The interchangeable test adapter is constructed and arranged to be received in the receiver. It includes a generally rectangular test adapter frame. Interior portions of the test adapter frame are constructed and arranged to carry electrical contacts. One or more rollers are mounted on each of left and right exterior sides of the test adapter frame.

A further aspect of the invention relates to a hanger assembly constructed and arranged to be mounted in a receiver. The hanger assembly comprises a hanger structure and a hanger slide retaining member. The hanger structure includes a downwardly inclined slot having a depth equal to at least a portion of the thickness of the hanger structure. Outwardly extending guide rails are provided on upper and lower surfaces of the hanger structure. Receiving structures are provided on a rear surface of the hanger structure. Each of the receiving structures is constructed and arranged to receive at least a portion of a resilient member. The hanger slide retaining member includes a hanger slide channel constructed and arranged to receive at least a portion of the outwardly extending guide rails of the hanger structure. The hanger slide retaining member also includes movement stops.

An additional aspect of the invention relates to a method of engaging a receiver and an interchangeable test adapter. The method comprises resting interchangeable test adapter rollers on retractable hanger structures provided on the receiver and retracting the retractable hanger structures, thereby engaging the receiver and the interchangeable test adapter.

Other aspects, features, and advantages of the invention will be described in detail below.

BRIEF DESCRIPTION OF THE DRAWINGS

The invention will be described with respect to the following drawing figures, in which like numerals represent like features throughout the figures, and in which.

DETAILED DESCRIPTION

In the following description, directional terms, such as "left," "right," "top," "bottom," "vertical," and "horizontal" are used. These terms refer only to the coordinate system and perspectives shown in the Figures and are used for convenience.

Figure 1:
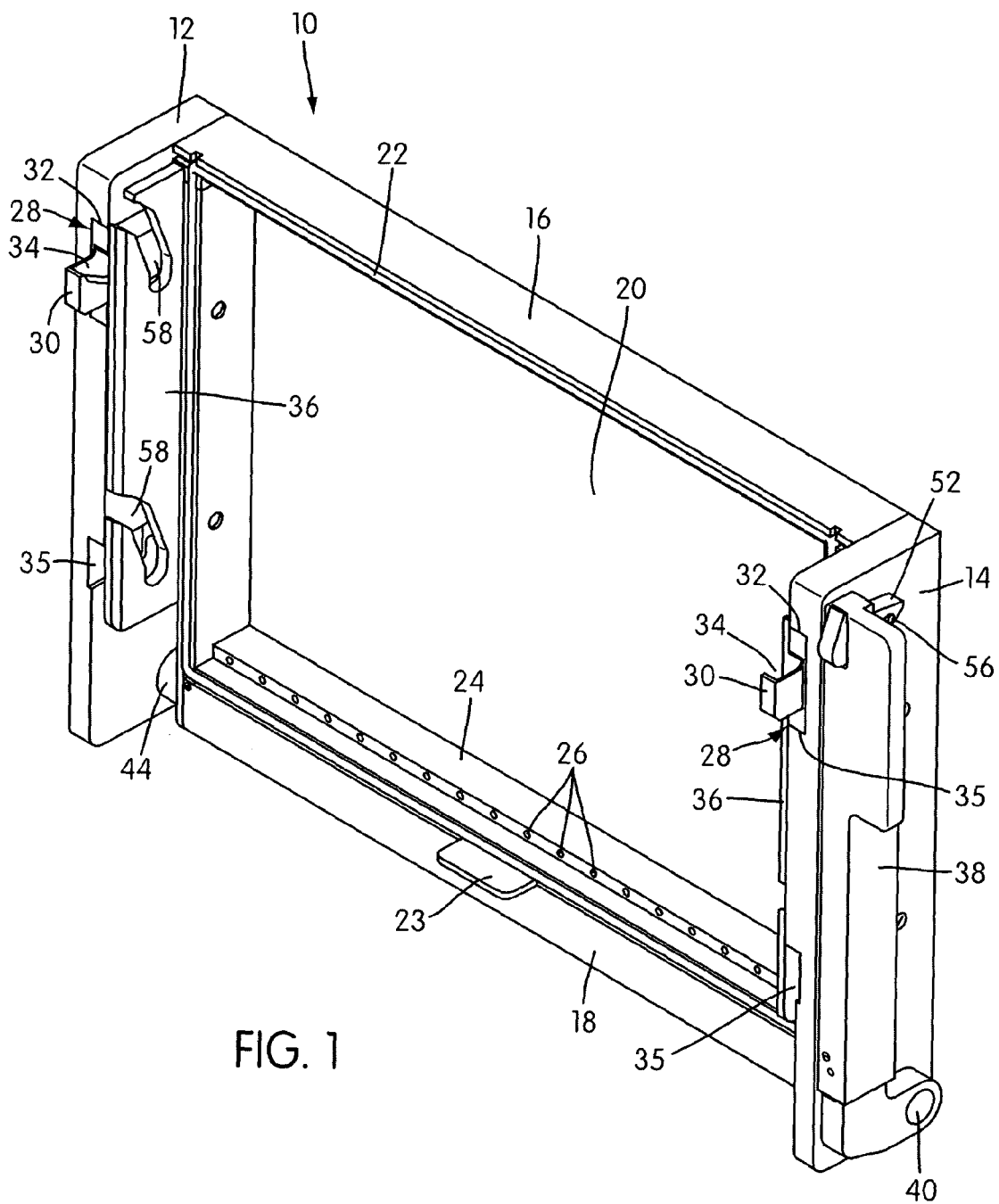
FIG. 1 is a perspective view of a receiver according to the present invention.

FIG. 1 is a perspective view of a receiver 10 according to one embodiment of the present invention. The receiver 10 is a generally rectangular frame comprised of left 12, right 14, top 16, and bottom 18 portions which define a central opening 20. A resilient, elastomeric sealing structure 22 is provided around the periphery of the central opening 20.

Figure 2:
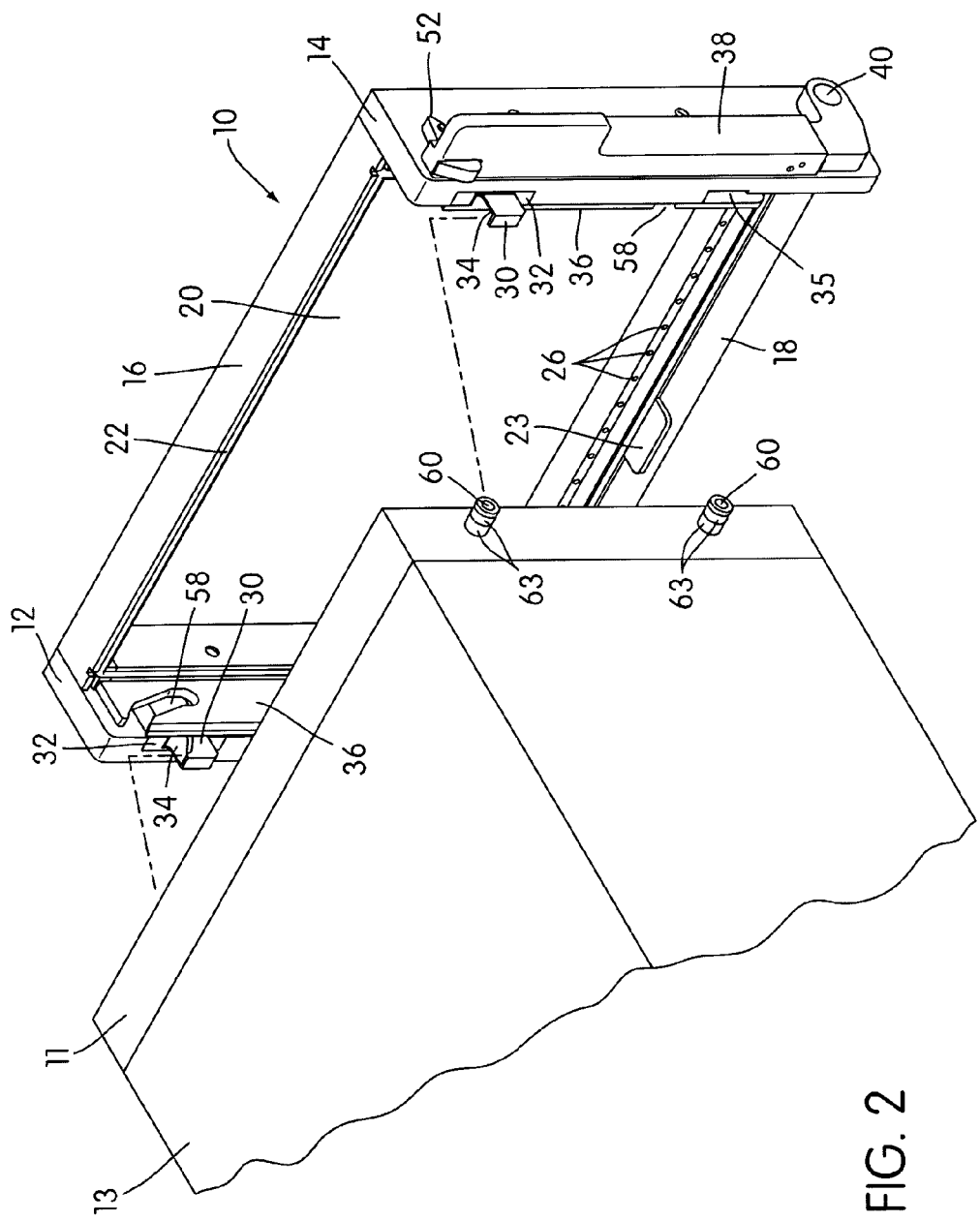
FIG. 2 is an exploded perspective view of the receiver of FIG. 1 and an interchangeable test adapter (ITA) designed to be engaged by the interchangeable test adapter.

The receiver 10 is constructed and arranged to carry a number of replaceable modules (not shown in the Figures), which are removably mounted to mounting blocks 24 on the top 16 and bottom 18 portions of the receiver 10. The replaceable modules are formed with apertures or other arrangements for securing electrical contacts therein, and the electrical contacts are, when mounted in the receiver, positioned to engage corresponding contacts in an interchangeable test adapter (ITA) 11, as will be described presently. The mounting blocks 24 for mounting modules are best seen in FIG. 2, a front elevational view of the receiver 10. Each of the mounting blocks 24 provides a number of fastener receptacles 26 that receive fasteners (not shown) to secure the replaceable modules in the receiver 10. The mounting hardware used to secure replaceable modules within the receiver 10 may vary with the type of replaceable module. The number of modules that the receiver 10 is capable of carrying and their spacing will also vary. Various modules are available to mount different types of contacts, for example, contacts that carry electrical power or electrical signals, or contacts of different construction. For example, coaxial and spring probe contacts, as well as other types of contacts known to those in the art, may be carried by the modules. The particular type of module (and contacts), number of modules per receiver 10, and their spacing within the receiver may be selected by one of skill in the art based on the particular application.

The receiver 10 is constructed and arranged to receive and engage an individual test adapter 11 of the general type shown and described in U.S. Pat. No. 4,329,005, the contents of which were incorporated by reference above, so as to cause the electrical contacts carried by the ITA 11 to engage with the corresponding contacts of the modules that are carried by the receiver 10. An ITA 11 is shown in the exploded view of FIG. 2. Each of the left and right sides of the ITA 11 includes a set of locating members that may be in the form of roller pins 60. Each of the pins 60 has a set of adjacent, independently moveable roller sleeves 63. The engagement of the ITA 11 and the receiver 10 will be described in more detail below. The ITA 11 of FIG. 2 also carries an enclosure 13, which may include electromagnetic shielding.

Each of the left 12 and right 14 portions of the receiver 10 includes a sliding hanger assembly, generally indicated at 28. The sliding hanger assembly 28 is comprised of a hanger structure 30 and a hanger slide retainer 32, both of which will be described in greater detail below. As shown in FIGS. 1 and 2, the sliding hanger assemblies 28 are mounted in recesses 35 on the left 12 and right 14 portions of the receiver 10 so as to be flush with the inwardly facing surfaces of the left 12 and right 14 portions. The hanger structure 30 provides a guide slot 34 which is sized to accommodate an ITA roller pin 60. The receiver 10 includes two hanger assemblies 28, one on each of the left 12 and right 14 portions of the receiver, positioned so as to engage upper roller pins 60 of the ITA 11. However, a receiver according to the invention may include one hanger assembly 28 for each roller pin of an ITA 11. Recesses 35 are provided lower on the left 12 and right 14 portions for the installation of additional hanger assemblies 28, if desired. However, two hanger assemblies 28 are sufficient to carry the weight of a typical ITA 11, and more hanger assemblies 28 may make it difficult for the user to align and seat the ITA 11 in the hanger assemblies 28. In general, hanger assemblies 28 may be secured within the recesses 35 using fasteners or other similar securing structures.

Mounted inwardly adjacent to the sliding hanger assemblies 28 on the left 12 and right 14 portions are left and right cam plates 36. The two cam plates 36 are mounted in a conventional manner so as to slide upwardly and downwardly (with respect to the coordinate system of the Figures). The motion of the two cam plates is coincident and simultaneous, and is driven by a user actuating a lever assembly. The lever assembly comprises a lever 38 that is mounted on the right 14 portion of the receiver 10. The lever 38 pivots about an axis defined by one end of a torsion shaft 40 that runs the length of the receiver 10 and connects to two drive linkages 42, one on each of the left and right sides of the receiver 10.

Figure 3:
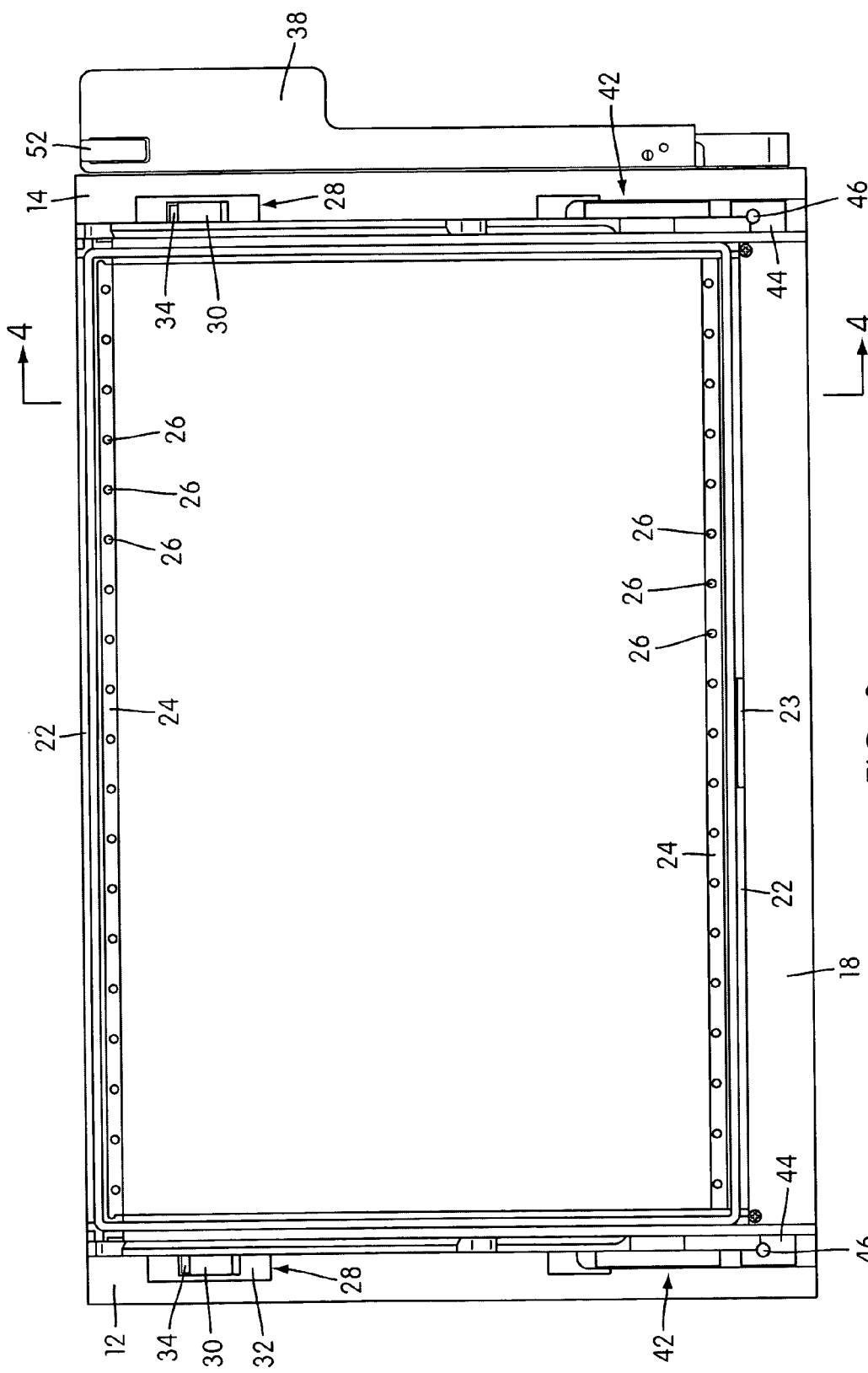
FIG. 3 is a front elevational view of the receiver of FIG. 1.
Figure 5:
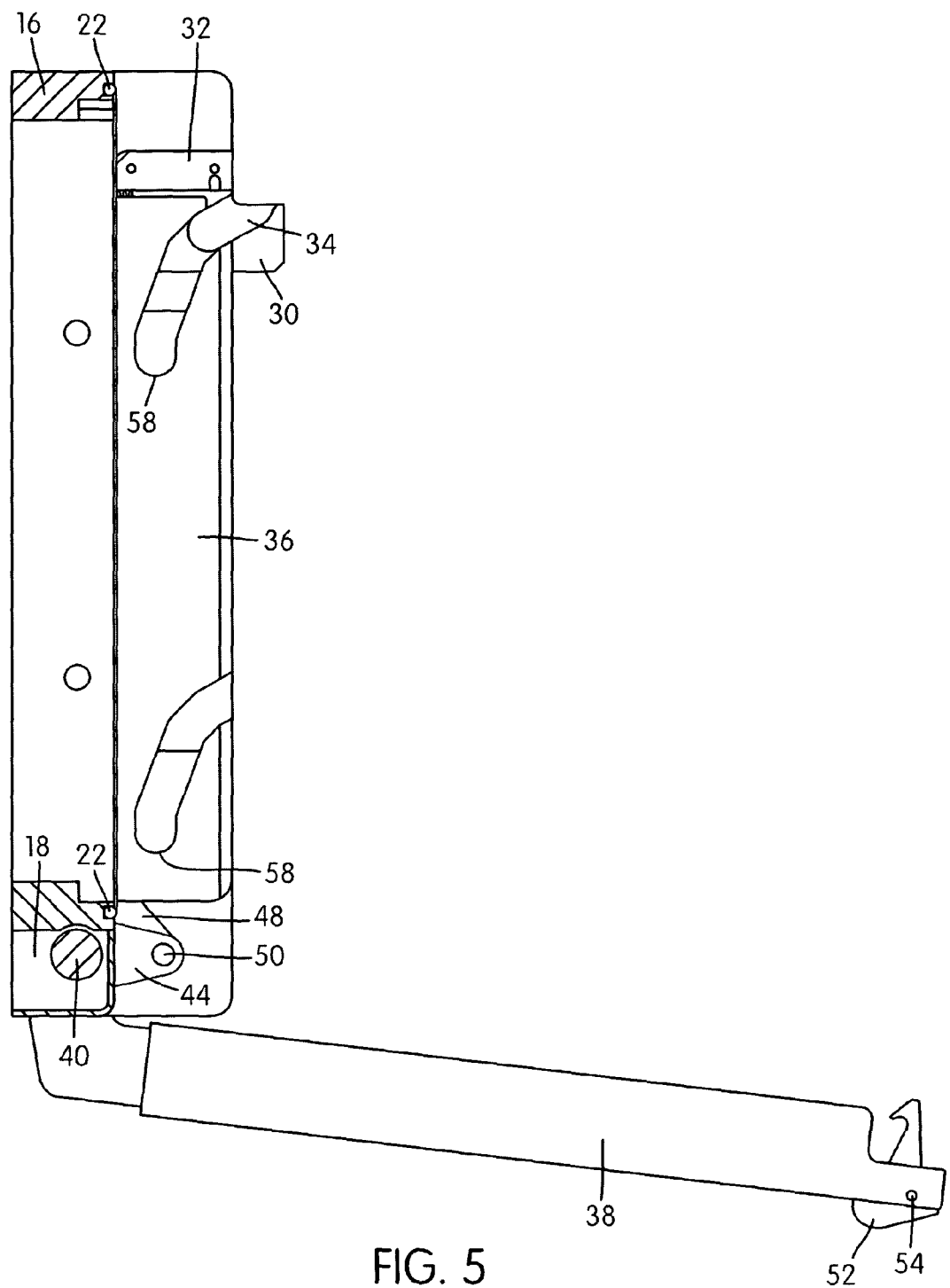
FIG. 5 is a sectional elevational view similar to that of FIG. 4, showing the receiver and hanger structure in an operative position ready to receive the ITA.

The drive linkages 42 couple the vertical movement of the cam plates 36 with the movement of the lever 38. As shown in FIGS. 3 and 5, each of the drive linkages 42 includes a drive link 44, which, in the illustrated embodiment, circumscribes and is secured to the torsion shaft 40 by a pin 46. A second link 48 is connected at one end by a pivot pin 50 to the drive link 44 and at the other end by another pivot pin 50 to the cam plate 36. The second link 48 and pivot pin 50 can be seen most clearly in the operative views of FIGS. 5–7. Those of ordinary skill in the art will realize that the drive linkages 42 shown in the Figures are only one way in which the motion of the lever 38 can be coupled to the cam plates 36 so as to be in driving relation with them. Other types of linkages and movement connections may be used in embodiments of the invention.

In order to prevent accidental movement of the lever 38, which would result in accidental movement of the cam plates 36, a rocker catch 52 is provided within the top portion of the lever 38 so as to pivot about a pin 54 within the lever 38. An engaging end of the rocker catch 52 engages a stationary pin 56 that is fixedly mounted on the right portion 14 of the receiver 14. The rocker catch 52 is biased by a torsion spring (not shown in the Figures) to remain engaged with the stationary pin 56 unless actuated by the user. Although shown as connected to the right portion 14 of the receiver 10, the lever 38 may be mounted on any user-accessible surface of the receiver 10, provided that appropriate structures and/or drive linkages can be provided to couple the motion of the lever 38 with that of the cam plates 36. Additionally, the lever 38 could have an extendable handle or another mechanism for increasing the leverage provided to the user.

Each of the cam plates 36 includes one or more cam slots 58. The number of cam slots 58 generally corresponds to the number of roller pins 60 provided on the ITA 11 with which the receiver 10 is designed to engage. The cam slots 58 are each sized to accommodate an ITA roller pin 60 and, when engaged with an ITA roller pin 60 (during upward movement of the cam plates 36), to cause the ITA 11 to move inwardly, into engagement with the receiver 10 so that the electrical contacts carried by the ITA 11 are brought into engagement with corresponding the electrical contacts carried by the receiver 10. Likewise, during downward movement of the cam plates 36, the cam slots 58 will cause the ITA to move outwardly, so that the electrical contacts carried by the ITA are disengaged from the corresponding electrical contacts carried by the receiver 10.

FIGS. 4–8 are sectional views of the receiver 10 taken through Line 3—3 of FIG. 2 that show the right portion 14 of the receiver 10, including the right cam plate 36 and the lever 38 in various operative positions. The movement of the left cam plate 36 on the left portion 12 of the receiver 10 is identical to that shown in FIGS. 4–8.

Figure 4:
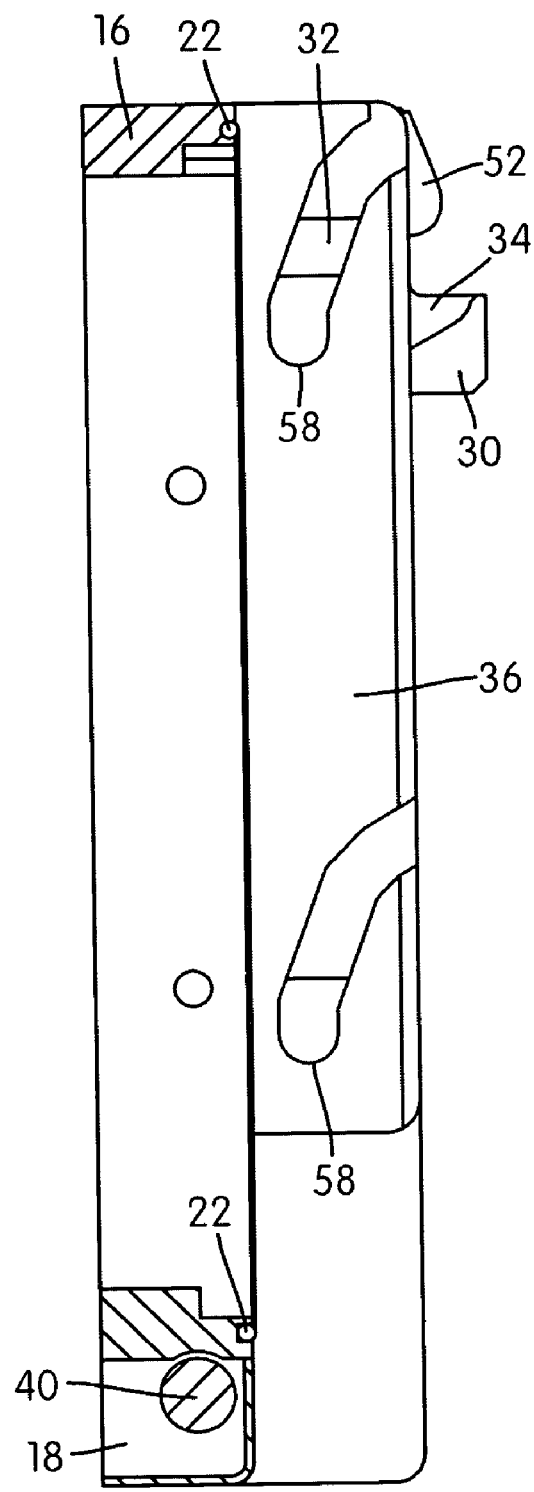
FIG. 4 is a sectional elevational view of one side of the receiver of FIG. 1, taken through Line 4—4 of FIG. 3.

FIG. 4 illustrates the relative positions of the cam plate 36, lever 38 and sliding hanger assembly 28 when the lever 38 is in its upwardmost position with the rocker catch 52 engaged on the stationary pin 56. This position might be used, for example, if the receiver 10 is stored without being mated with an ITA. As shown in FIG. 4, and also to some extent in FIGS. 1 and 2, the sliding hanger structure 30 is biased to remain in a fully extended position in the absence of any external horizontal forces acting on it by a set of compression springs (not shown in the Figures) that are secured at one end within the respective left 12 and right 14 portions of the receiver 10 and that have second ends that are received within the hanger structures 30, as will be described below in more detail.

FIG. 5 is a sectional view similar to that of FIG. 4. In the operative position shown in FIG. 5, the lever 38 has been moved to its downward stop position. (Because the cam plates 36 and lever 38 are coupled, the downward stop position of the lever 38 is determined by the maximum downward travel of the cam plates 36, which may be modified by changing the relative size of the cam plates 36 and the length of the channel in which the cam plates 36 are mounted for sliding movement.) When the lever 38 is in its downward stop position, the upper portion of the upper cam slot 58 on each cam plate 36 coincides with the position of the guide slot 34 in each hanger structure 28, such that a roller pin 60 of an ITA 11 may be received in both the cam slot 58 and the guide slot 34.

Figure 6:
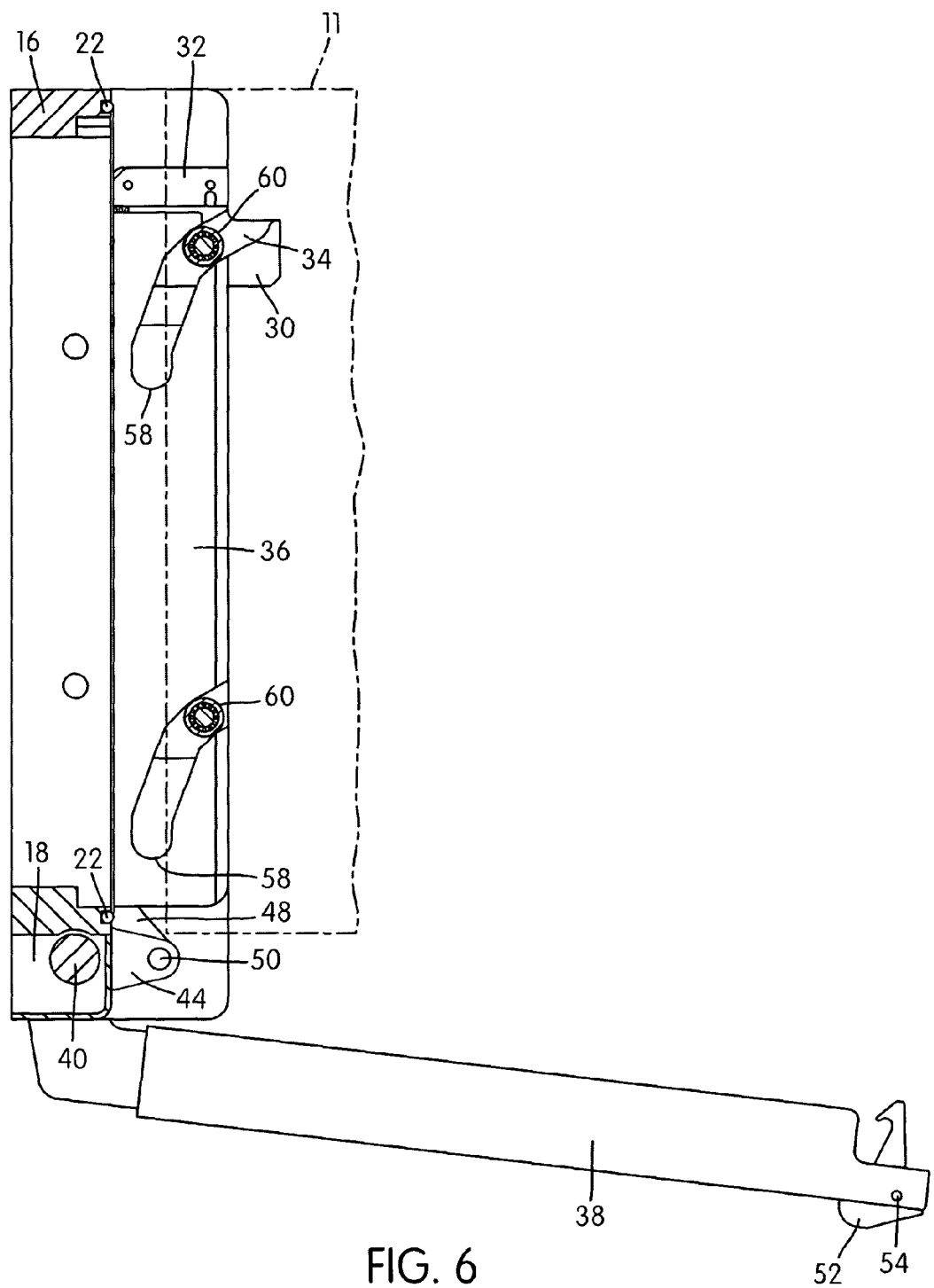
FIG. 6 is a sectional elevational view similar to that of FIG. 4, showing the rollers of an ITA resting in the hanger structure and cam slot of the receiver with the receiver and ITA in a disengaged position.

FIG. 6 is a view of the receiver 10 similar to that of FIG. 5, illustrating a roller pin 60 seated in the guide slot 34 of the hanger structure 30. The engaging portion of the ITA 11 itself is illustrated in phantom in FIGS. 6–8. The roller pin 60 would typically be positioned such that one of its roller sleeves 63 is in contact with the guide slot 34 and the other roller sleeve 63 is in contact with the cam slot 58. To reach the position illustrated in FIG. 6, the user would rest the ITA rollers 60 in the guide slots 34 of the hanger structure 30. As shown, the lower roller pin 60 of the ITA rests only in the lower cam slot 58 of the cam plate 36, since no hanger assembly 28 is installed in the lower recesses 35 of the receiver 10. However, if a hanger assembly 28 were installed inwardly adjacent to the lower cam slot 58, the lower roller pin 60 of the ITA would rest in both the guide slot 34 and the cam slot 58 as well. Typically, the guide slots 34 locate the ITA 11 with sufficient accuracy that the lower roller pins 60 enter the lower cam slots 58 without significant effort from the user. If necessary, the upper roller pins 60 may be used as a pivot to help seat the lower roller pins 60 in the lower cam slots 58.

Figure 7:
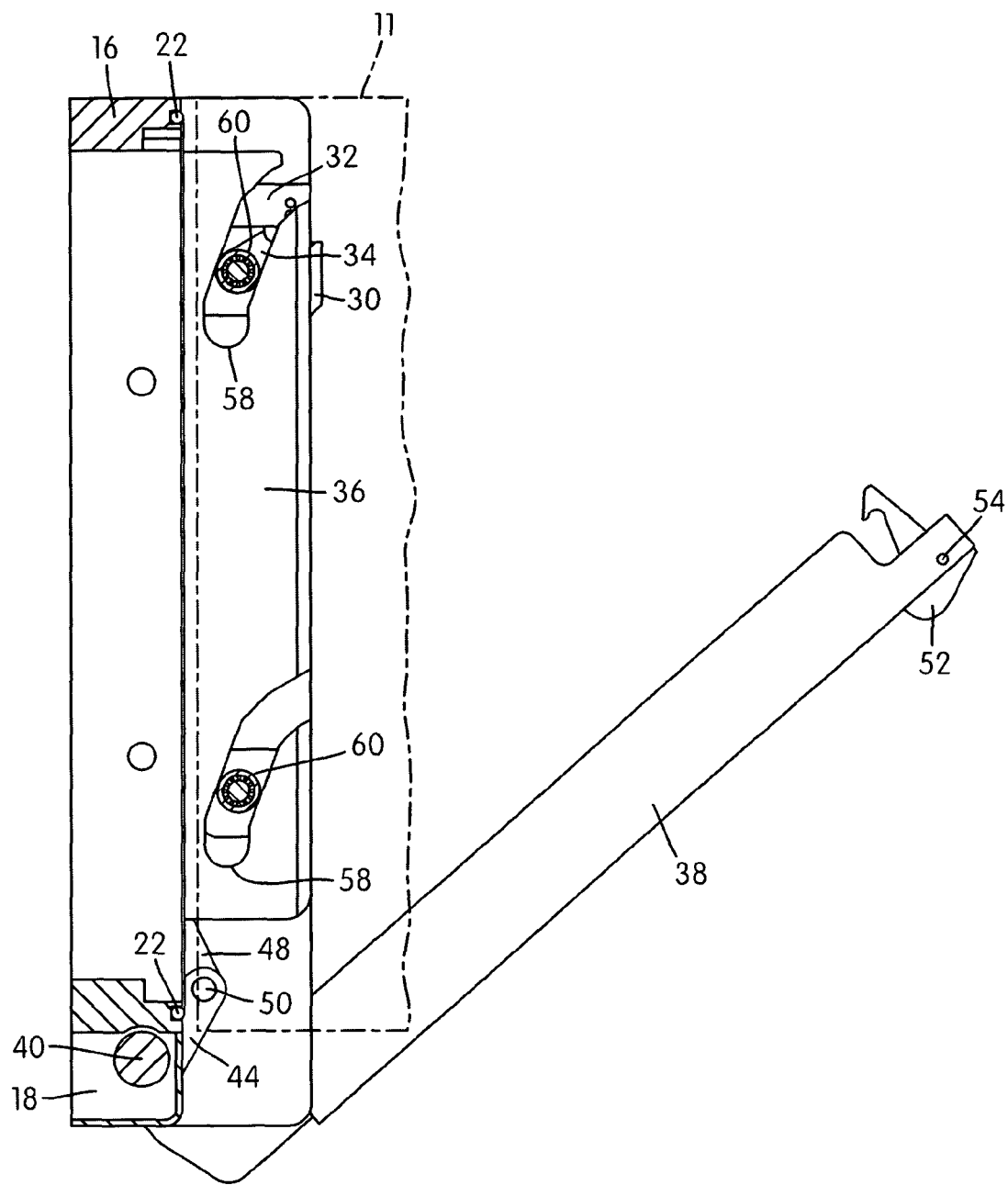
FIG. 7 is a sectional elevational view similar to that of FIG. 4, showing the rollers of an ITA resting in the hanger structure and cam slot of the receiver with the receiver and ITA in a partially engaged position, as they move towards a fully engaged position.

When a roller pin 60 is resting partially in the cam slot 58 and partially in the guide slot 34, the roller pin 60 couples the movement of the cam plate 36 with that of the hanger structure 30. FIG. 7 is a sectional view similar to that of FIG. 6. In the operative position illustrated in FIG. 7, the lever 38 has been rotated upwardly, causing the cam plate 36 to slide upwardly and, therefore, forcing the hanger structure 30 to retract within the hanger slide retainer 32.

Figure 8:
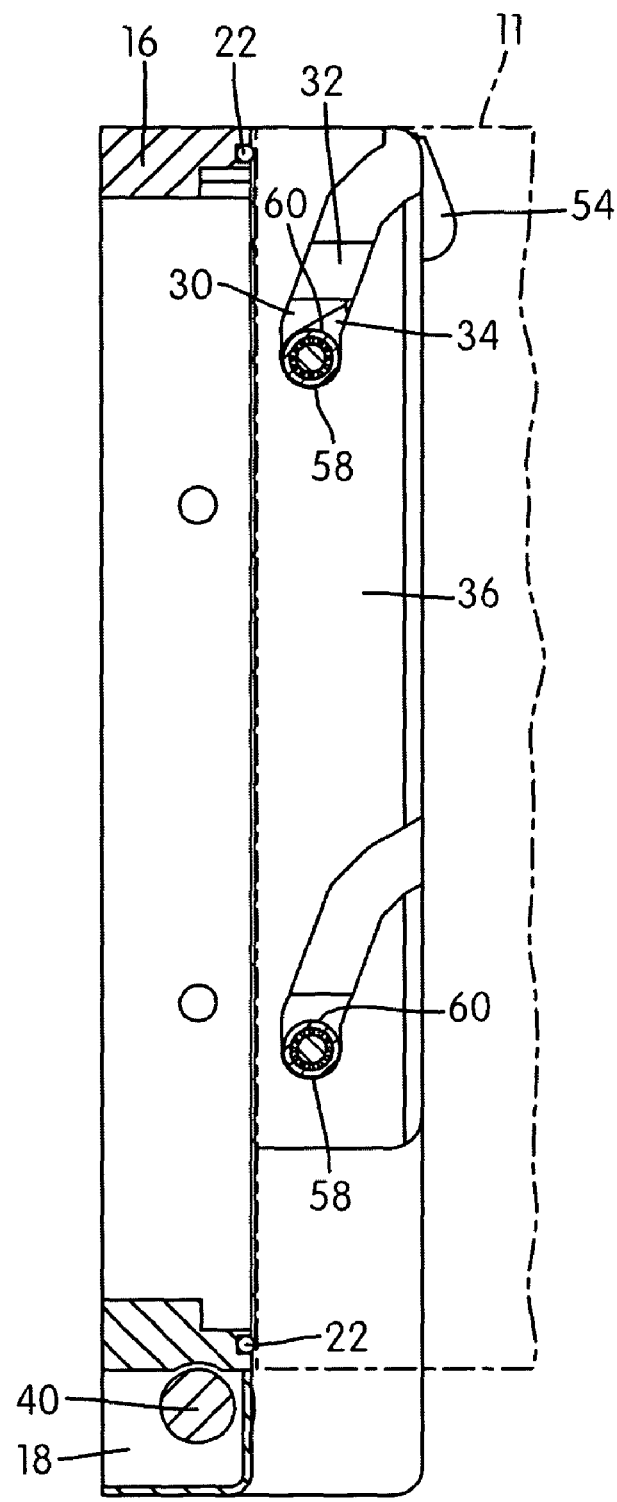
FIG. 8 is a sectional elevational view similar to that of FIG. 5, showing the rollers of an ITA resting in the hanger structure and cam slot of the receiver with the receiver and ITA in a fully engaged position.

FIG. 8 is a sectional view similar to that of FIG. 7. In the position illustrated in FIG. 8, the lever 38 has been rotated to reach its upwardmost position with the rocker catch 52 engaged. In this position, the hanger structure 30 is forced, by motion of the roller pin 60, into a retracted position that makes it flush with the front surface of the right portion 14 of the receiver 10. In the position of FIG. 8, the ITA 11 is fully engaged with the receiver 10, such that electrical contacts carried by the ITA 11 and receiver 10 would be engaged. The ITA 11 abuts the sealing structure 22, forming a moisture-resistant seal between the ITA 11 and the receiver 10. In the fully engaged position, a tongue 23 on the bottom portion 18 of the receiver 10 fits into a recess on the underside of the ITA 11, forcing the receiver 10 and ITA 11 into vertical registration with one another. During the engaging movement of the ITA 11 and receiver 10 illustrated in FIGS. 6–8, the guide slot 34 prevents vertical motion of the ITA 11 roller pins 60. In general, the guide slots 34, cam slots 58 and tongue 23 cooperatively act to establish and maintain the proper alignment of the ITA 11 during the engaging movement.

One advantage provided by the hanger assemblies 28 during the initial portion of the operational sequence shown in FIGS. 6–8 is that after placing the rollers 60 of the ITA 11 in the guide slots 34 of the hanger structures 30, the user does not need to push the ITA 11 into position rearwardly so that the rollers 60 can be engaged in the cam slots 58. Instead, because the guide slots 34 are inclined with respect to the horizontal, the ITA rollers 60 are guided downward into the proper position.

The receiver 10 would typically be made of a metal, such as aluminum or steel. If the material is aluminum, it may be an alloy such as 2024-T351 aluminum, and could optionally be surface treated or anodized. Receivers 10 are often used for military applications, in which case, one of ordinary skill in the art will realize that the receiver 10 and other parts should be made and finished to the appropriate military specifications. For example, MIL-A-8625 governs the finishing and anodizing of aluminum, and is one of many standards and specifications that may govern the manufacture and finishing of a receiver 10 according to the invention.

Figure 9:
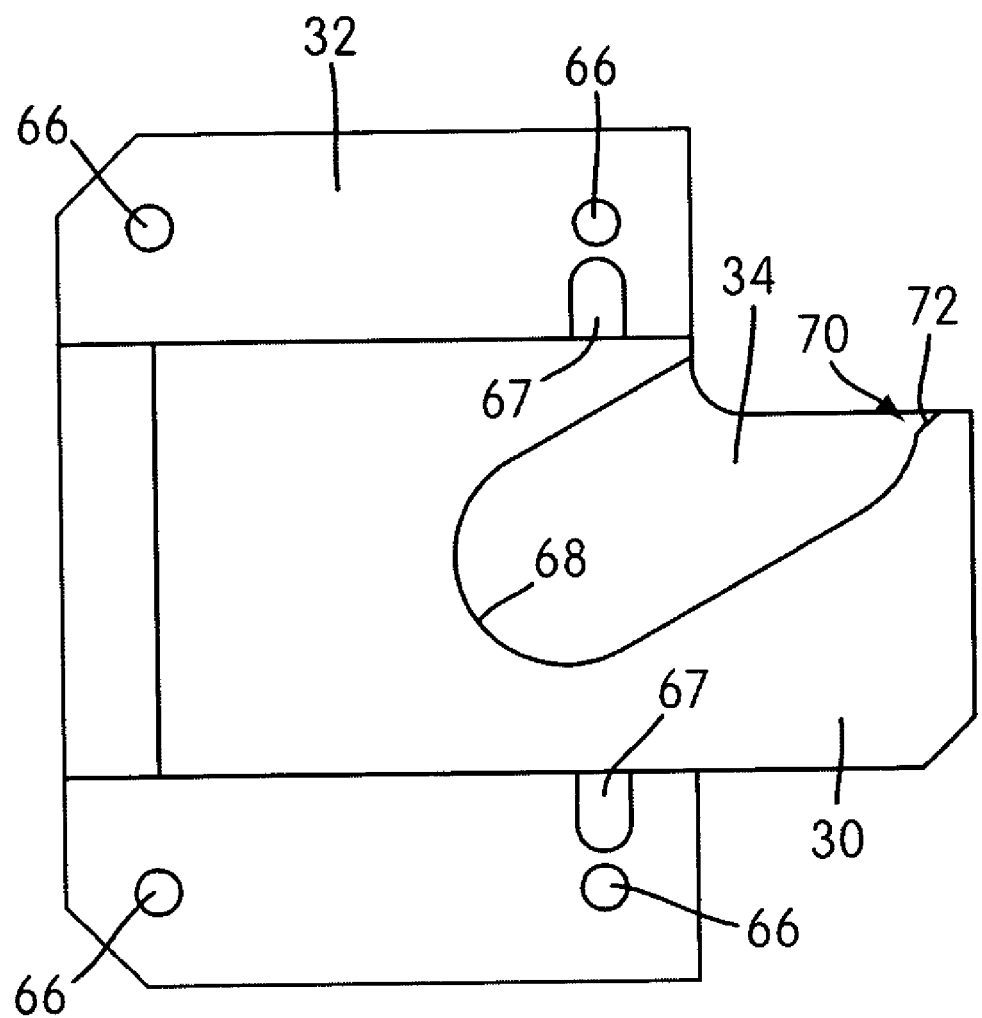
FIG. 9 is a side elevational view of a hanger structure mounted within a hanger slide retainer.
Figure 10:
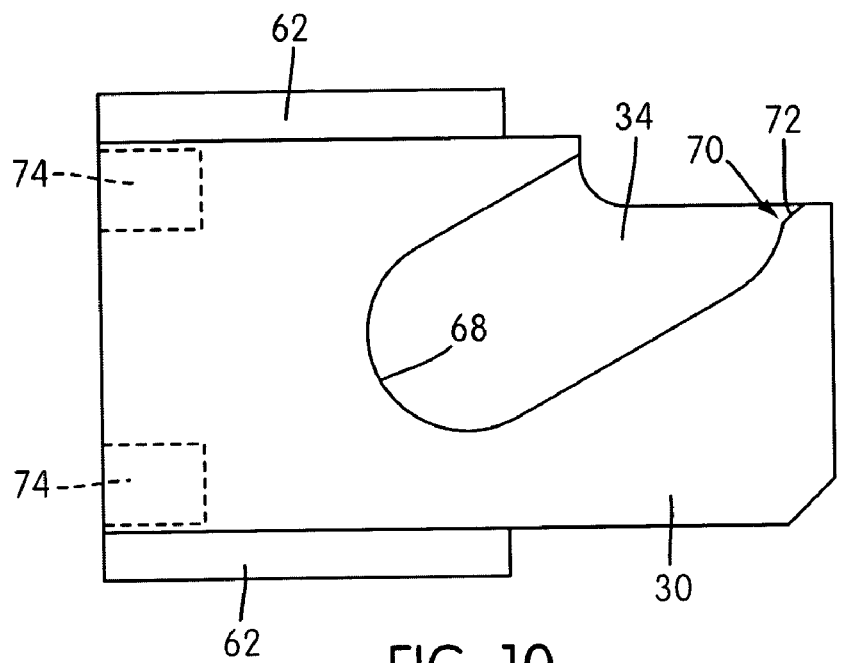
FIG. 10 is a side elevational view of a hanger structure in isolation.

FIG. 9 is a side elevational view of a hanger structure 30 mounted within a hanger slide retainer 32. FIG. 10 is a side elevational view of a hanger structure 30 in isolation. As shown in FIGS. 9 and 10, the hanger structure 30 is substantially rectangular in shape with upper and lower guide rails 62, also referred to as "dogs," on the top and bottom surfaces thereof. The upper and lower guide rails 62 extend over approximately the rear two-thirds of the hanger structure 30. The hanger structure 32 is generally made of a rigid material, such that it may support a fully loaded ITA 11 without significant deformation. If the material is steel, it may optionally be heat treated so as to improve its strength. For example, the hanger structure 32 could be made of a metal such as 4142 steel, hardened to 40–50 Rockwell C hardness.

Figure 13:
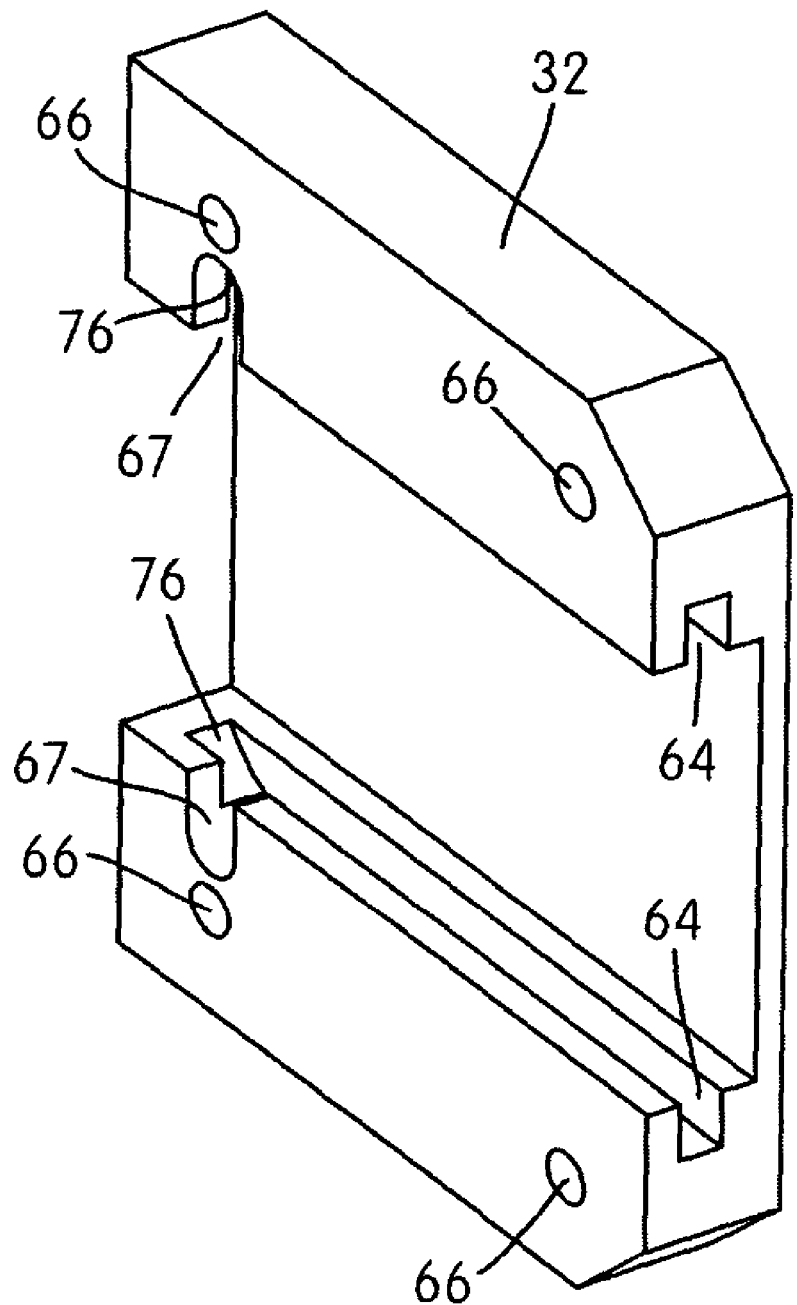
FIG. 13 is a perspective view of the hanger slide retainer without a hanger structure mounted therein.

The upper and lower guide rails 62 are sized and adapted to engage and slide within upper and lower channels 64 of the hanger slide retainer 32, which are illustrated in FIG. 13, a perspective view of the hanger slide retainer 32. The hanger slide retainer 32 includes fastener holes 66 that are constructed and arranged to receive fasteners to secure the hanger slide retainer 32 within the left 12 and right 14 portions of the receiver 10. The fastener holes 66 may be threaded or otherwise configured to accept particular types of fasteners.

As was described above, the hanger structure 30 includes a guide slot 34 formed therein. The guide slot 34 is angled with respect to the horizontal and is sized and configured to accommodate a roller pin 60 from an ITA. The bottom portion 68 of the guide slot 34 has a curvature that matches the curvature of the roller pin 60. The top lower edge 70 of the guide slot 34 curves upwardly and then terminates with a straight, sloped portion 72. In one embodiment, the overall incline of the guide slot 34 (which would match that of an upper portion of the cam slot 58) may be about 30 degrees with respect to the horizontal. The straight, sloped portion 72 of the top lower edge 70 may be inclined at a different angle, for example, about 45 degrees to the horizontal.

In other embodiments of the invention, the guide slot 34 could be a straight slot without an upwardly angled top lower edge 70. However, the upwardly angled profile of the top lower edge 70 of the guide slot 34 serves several functions. First, the upward curvature or contour at the end of the guide slot 34 prevents the ITA 11 from being ejected (i.e., "kicking out") from the guide slot 34 when the receiver 10 and ITA 11 are disengaged. Second, the top lower edge 70 of the guide slot 34 provides an outward "stop" that can be used to align the ITA with the lower cam slots 58 once the roller pins 60 are resting in the guide slots 34 of the hanger structures 30, so that the roller pins 60 can be inserted into the lower cam slots 58 of the receiver 10.

Figure 11:
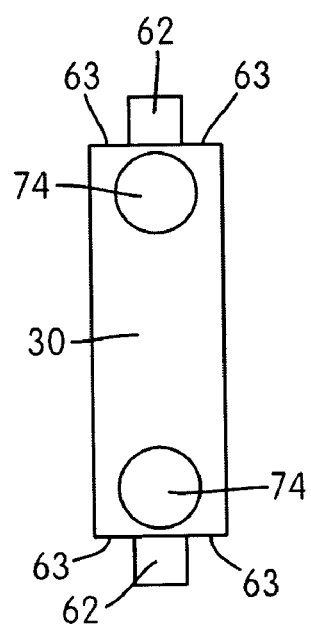
FIG. 11 is a rear end elevational view of the hanger structure of FIG. 8.
Figure 12:
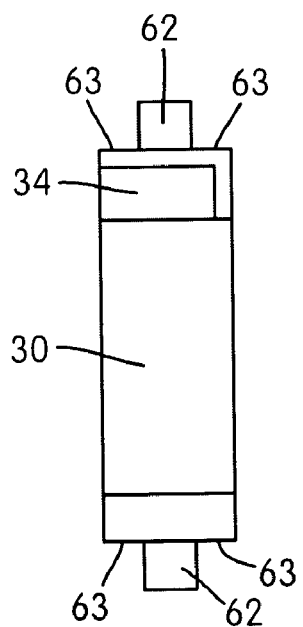
FIG. 12 is a front end elevational view of the hanger structure of FIG. 8.

FIGS. 11 and 12 are rear and front elevational views, respectively, of the hanger structure 30 in isolation. As was described above, the hanger structure 30 receives the ends of compression springs or other resilient members in appropriate spring receiving holes 74 or other structures, which may be counterbored to provide an appropriate bearing surface for the springs (not shown in the Figures). When the hanger structure 30 is slidingly mounted within the channels 64 of the hanger slide retainer 30, the springs, which bear on one end against the receiver 10 and at the other end against a bearing surface within the spring receiving holes 74 of the hanger structure 30, bias the hanger structure 30 forwardly, towards the fully extended position illustrated in FIG. 1. As shown in FIG. 11, the hanger slide retainer 32 includes a forward stop 76 at the forward end of each channel 64. The forward stops 76 prevent the hanger structure 30 from sliding forwardly any farther than the position illustrated in FIG. 1.

Adjacent to the forwardmost fastener holes 66 in the hanger slide retainer 32 are two generally semicircular cutouts 67. The semicircular cutouts 67 do not have an operational function in the hanger slide retainers 32. Instead, the semicircular cutouts 67 are included as a matter of manufacturing convenience, because they provide better access for tooling used to machine the forward stops 76 in one process for manufacturing the hanger slide retainer 32. As those of skill in the art will appreciate, the semicircular cutouts 67 may be omitted. Additionally, the hanger slide retainer 32 and the hanger structure 30 may include other such "access features" in order to facilitate the manufacturing process.

In a typical application, the hanger structure 30 and hanger slide retainer 32 would be designed to collectively carry an ITA 11 having a weight of approximately 20–35 lbf. Most of that load would be carried by the shoulders 63 at the base of the upper and lower guide rails 62 of the hanger structure 30, because those parts of the hanger structure 30 bear directly against hanger slide retainer 32 when a load is placed on the hanger structure 30 in the vertical direction. That load may result in stresses of approximately 5000–6000 psi on each hanger structure 30 and hanger slide retainer 34.

In a preferred embodiment, the receiver 10 may be designed and dimensioned so as to particularly reduce the likelihood of excessive cantilevered deformation of the hanger structure 30 during operation. Several features of the receiver 10 are useful in this respect. First, the position of the forward stops 76 and the overall length of the hanger structures 30 would be chosen so as to leave only a short length of the hanger structure 30 projecting beyond the receiver 10. Second, because the hanger structure 30 retracts as the majority of the forces are being applied (i.e., during the engagement of receiver 10 with the ITA 11, typically between the positions illustrated in FIGS. 6 and 7), it is not fully extended when the largest of the forces are applied. Additionally, the components themselves would typically be made to a tolerance of a few thousandths of an inch, and may be inspected during use for any excessive wear which might cause excessive loads and/or failure.

As those of skill in the art will realize, the receiver 10 with sliding hanger structures 30 provides certain advantages over prior art devices. First, the sliding hanger structures 30 are biased to extend forwardly and move independently of the lever assembly and sliding cam plates 36 (unless a roller pin 60 of an ITA 11 is placed in both the cam slot 58 and the guide slot 34). Therefore, a user may rest an ITA 11 in the hanger structures 30 without actuating the lever 38 or performing any other operation. This feature is extremely convenient for the user. Additionally, as was described above, because of the inclination of the guide slots 34, the user does not have to push the ITA 11 into position so that its roller pins 60 engage the cam slots 68.

Figure 14:
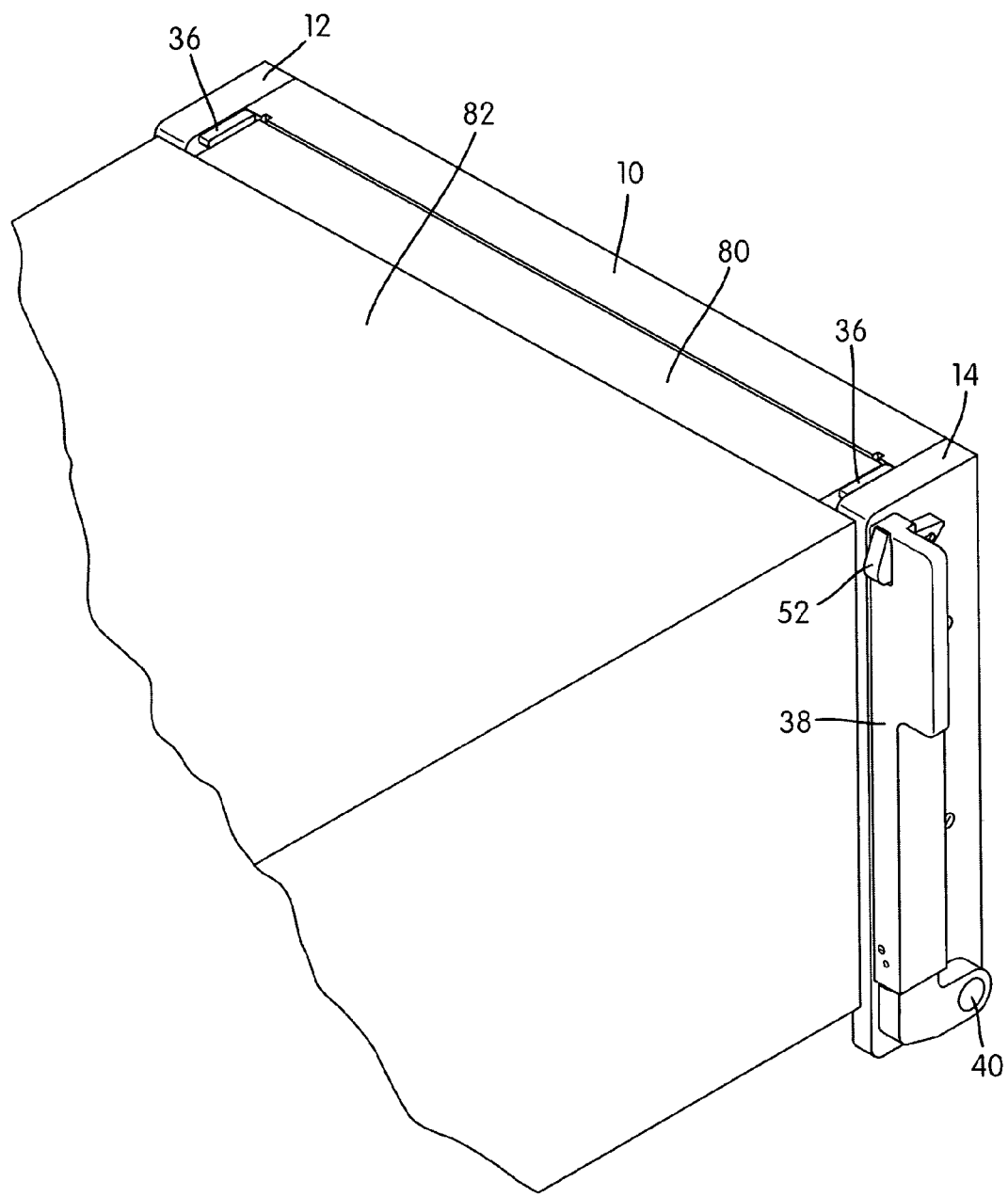
FIG. 14 is a perspective view illustrating a receiver in engagement with an ITA including an electromagnetic shielding enclosure.

A second advantage of the receiver 10 is illustrated in the perspective view of FIG. 14, which shows a receiver 10 in engagement with an ITA 80 which is slightly different than the ITA 11 shown in the previous Figures. The ITA 80 includes an attached electromagnetic shielding enclosure 82, a portion of which is shown in FIG. 14. Because the hanger structures 30 retract as the lever 38 is actuated to bring the receiver 10 and ITA 80 into engagement, when the receiver 10 and ITA 80 are fully engaged, the hanger structures 30 are flush with the left 12 and right 14 portions of the receiver 10. The electromagnetic shielding enclosure 82 is designed to take advantage of this feature; as shown, it is slightly wider than the ITA 80 and extends over the left 12 and right 14 portions of the receiver 10. This configuration would not be possible in prior art designs because typical prior art hanger structures always project outwardly from the receiver, and would thus obstruct the engagement of an ITA and enclosure such as those illustrated in FIG. 14.

Although the invention has been described with respect to certain embodiments, those embodiments are to be construed as exemplary, rather than limiting. Modifications and variations to the invention may be made, within the scope of the appended claims.

What is claimed is:

1. A receiver structure for receiving a test adapter having external locating portions comprising:
   a generally rectangular frame having left and right inwardly facing surfaces;
   left and right cam plates slidingly mounted adjacent to the left and right inwardly facing surfaces of the generally rectangular frame, each of the left and right cam plates including a cam slot;
   a lever assembly including a user accessible lever portion, the lever assembly being arranged in a driving relationship with the left and right cam plates; and
   two or more hanger structures, one of the hanger structures being mounted adjacent to each of the left and right cam plates for sliding movement between an outwardly projecting position and a retracted position, the hanger structures each including a guide slot.

2. The receiver structure of claim 1, wherein portions of the guide slots are aligned with portions of the cam slots of the adjacent left and right cam plates, such that the hanger structures may be driven between the outwardly projecting position and the retracted position by the movement of the cam plates when the guide slots and cam slots co-engage the external locating portions of the test adapter.

3. The receiver structure of claim 2, further comprising two or more hanger slide retainers, each of the hanger slide retainers including:
   a channel constructed and arranged to accommodate one of the hanger structures; and
   movement stops.

4. The receiver of claim 3, wherein each of the hanger structures further comprises guide rails on upper and lower surfaces thereof.

5. The receiver of claim 4, wherein the hanger slide retainers are constructed and adapted to be mounted within the generally rectangular frame so as to define portions of the left and right inwardly facing surfaces, respectively.

6. The receiver of claim 5, wherein the movement stops of the hanger slide retainers comprise ends of the channels within the hanger structures.

7. The receiver of claim 6, wherein the hanger structures are constructed and arranged to be received for sliding movement within the channels of the hanger slide retainers.

8. The receiver of claim 7, wherein the outwardly projecting position of the hanger structures comprises the position in which the movement stops of the hanger slide retainers contact the guide rails of the hanger structures.

9. The receiver of claim 8, wherein each of the hanger structures further comprises receiving structures.

10. The receiver of claim 9, wherein resilient members are mounted between the generally rectangular frame and the hanger structures so as to be at least partially received within the receiving structures of the hanger structures, the resilient members being constructed and arranged to bias the hanger structures toward the outwardly projecting position.

11. The receiver of claim 10, wherein the resilient members are springs.

12. The receiver of claim 10, wherein the receiving structures are counterbored holes.

13. The receiver of claim 1, wherein the guide slot is generally downwardly sloped.

14. The receiver of claim 13, wherein the guide slot is generally straight.

15. The receiver of claim 14, wherein the guide slot includes an upwardly angled end surface.

16. The receiver of claim 1, wherein the hanger structures are formed of a metal.

17. The receiver of claim 16, wherein the metal is steel.

18. The receiver of claim 1, wherein two hanger structures are provided.

19. A testing apparatus comprising:
   a receiver, including
      a generally rectangular receiver frame having left and right inwardly facing surfaces, interior portions of the generally rectangular receiver frame being constructed and arranged to carry electrical contacts;
      left and right cam plates slidingly mounted adjacent to the left and right inwardly facing surfaces of the generally rectangular receiver frame, each of the left and right cam plates including a cam slot;
      a lever assembly including a user accessible lever portion, the lever assembly being arranged in a driving relationship with the left and right cam plates; and
      two or more hanger structures, one of the hanger structures being mounted adjacent to each of the left and right cam plates for sliding movement between an outwardly projecting position and a retracted position, each of the hanger structures including a guide slot; and
   an interchangeable test adapter constructed and arranged to be received in the receiver, including
      a generally rectangular interchangeable test adapter frame, interior portions of the generally rectangular interchangeable test adapter frame being constructed and arranged to carry electrical contacts; and
      one or more rollers mounted on each of respective left and right exterior sides of the generally rectangular interchangeable test adapter frame.

20. The testing apparatus of claim 19, wherein portions of the guide slots are aligned with portions of the cam slots of the adjacent left and right cam plates, such that the hanger structures may be driven between the outwardly projecting position and the retracted position by the movement of the cam plates when the hanger slots and cam slots co-engage the rollers of the interchangeable test adapter.

21. The testing apparatus of claim 20, wherein the receiver further comprises two or more hanger slide retainers, each of the hanger slide retainers including:
 a channel constructed and arranged to accommodate one of the hanger structures; and
 movement stops.

22. The test apparatus of claim 21, wherein each of the hanger structures further comprises guide rails on upper and lower surfaces thereof.

23. The test apparatus of claim 22, wherein the hanger slide retainers are constructed and adapted to be mounted within the generally rectangular receiver frame so as to define portions of the left and right inwardly facing surfaces, respectively.

24. The test apparatus of claim 23, wherein the movement stops of the hanger slide retainers comprise ends of the channels within the hanger structures.

25. The test apparatus of claim 24, wherein the hanger structures are constructed and arranged to be received for sliding movement within the channels of the hanger slide retainers.

26. The test apparatus of claim 25, wherein the outwardly projecting position of the hanger structures comprises the position in which the movement stops of the hanger slide retainers contact the engaging portions of the hanger structures.

27. The test apparatus of claim 26, wherein each of the hanger structures further comprises receiving structures.

28. The test apparatus of claim 27, wherein resilient members are mounted between the generally rectangular receiver frame and the hanger structures so as to be at least partially received within the receiving structures of the hanger structures, the resilient members being constructed and arranged to bias the hanger structures toward the outwardly projecting position.

29. The test apparatus of claim 28, wherein the resilient members are springs.

30. The test apparatus of claim 28, wherein the receiving structures are counterbored holes.

31. The test apparatus of claim 19, wherein the guide slot is generally downwardly sloped.

32. The test apparatus of claim 31, wherein the guide slot is generally straight.

33. The test apparatus of claim 19, wherein the guide slot includes an upwardly angled end surface.

34. The test apparatus of claim 19, wherein the hanger structures are formed of a metal.

35. The test apparatus of claim 34, wherein the metal is steel.

36. The test apparatus of claim 19, wherein two hanger structures are provided.

* * * * *